United States Patent
Itabashi

(10) Patent No.: US 12,327,979 B2
(45) Date of Patent: Jun. 10, 2025

(54) OPTICAL SEMICONDUCTOR MODULE

(71) Applicant: SUMITOMO ELECTRIC INDUSTRIES, LTD., Osaka (JP)

(72) Inventor: Naoki Itabashi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 801 days.

(21) Appl. No.: 17/521,660

(22) Filed: Nov. 8, 2021

(65) Prior Publication Data

US 2022/0149592 A1 May 12, 2022

(30) Foreign Application Priority Data

Nov. 9, 2020 (JP) .................................. 2020-186793

(51) Int. Cl.
*H01S 5/042* (2006.01)
*H01S 5/022* (2021.01)
*H01S 5/024* (2006.01)
*H01S 5/026* (2006.01)
*H01S 5/068* (2006.01)

(52) U.S. Cl.
CPC .............. *H01S 5/042* (2013.01); *H01S 5/022* (2013.01); *H01S 5/02415* (2013.01); *H01S 5/026* (2013.01); *H01S 5/068* (2013.01)

(58) Field of Classification Search
CPC ....... H01S 5/022; H01S 5/02415; H01S 5/042
See application file for complete search history.

(56) References Cited

U.S. PATENT DOCUMENTS 11,336,072 B2 * 5/2022 Adachi ................. H01S 5/0239
2003/0127661 A1 * 7/2003 Takagi ................. H01S 5/02415
257/98

FOREIGN PATENT DOCUMENTS

JP    2004-088026    3/2004
JP    2017-107920    6/2017

OTHER PUBLICATIONS

Notice of Reasons for Refusal mailed relative to Japanese Patent Application No. 2020-186793, May 7, 2024 (4 pages Japanese, 4 pages English translation).

* cited by examiner

*Primary Examiner* — Michael Carter
(74) *Attorney, Agent, or Firm* — Smith, Gambrell & Russell, LLP

(57) ABSTRACT

An optical semiconductor module according to the embodiment includes: a board including a transmission line; a block including a low-permittivity material; an inductor mounted on the block, the inductor being connected with the transmission line via a first wire, the first wire having a first inductance; a semiconductor laser device mounted on the board, the semiconductor laser device being connected with the transmission line via a second wire, the second wire having a second inductance smaller than the first inductance; and a housing configured to accommodate the board, the block, the inductor, and the semiconductor laser device.

12 Claims, 11 Drawing Sheets

Fig.3
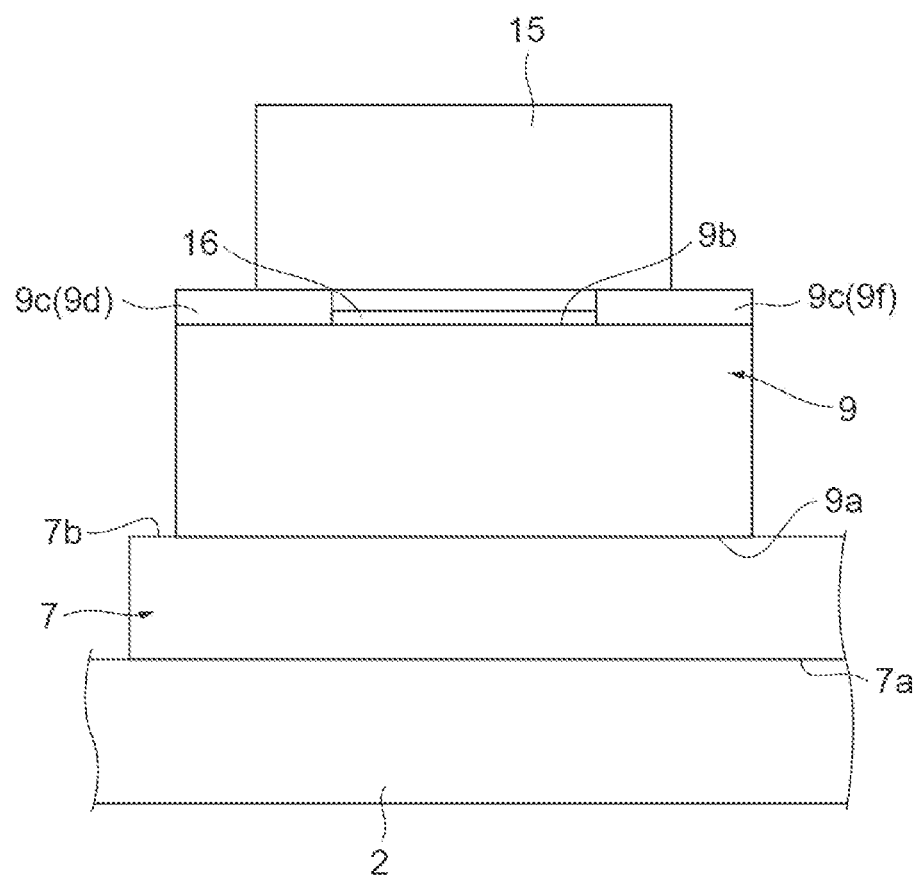
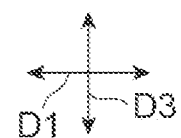

OPTICAL SEMICONDUCTOR MODULE

TECHNICAL FIELD

The present disclosure relates to an optical semiconductor module.

The application is based upon and claims the benefit of priority from Japanese Patent Application No. 2020-186793, filed Nov. 9, 2020, the entire contents of which are incorporated herein by reference.

BACKGROUND

Japanese Unexamined Patent Publication No. 2017-107920 discloses a semiconductor module having a laser unit and an optical modulator unit manufactured on a substrate. The semiconductor module includes a semiconductor laser in which a DFB laser and an EA modulator are integrated and a subcarrier having a high-frequency wiring which is a coplanar wiring. The semiconductor laser has a ground electrode on a back surface. A step difference formed with an upper stage and a lower stage is formed on an upper surface of the subcarrier. A lower surface of the subcarrier is flat. The high-frequency wiring has a coplanar line formed on the upper stage of the upper surface of the subcarrier. The coplanar line includes a ground wiring and a signal wiring. The ground electrode is formed in the lower stage of the upper surface of the subcarrier. The semiconductor laser is disposed so that the ground electrode provided on the back surface is in contact with the ground electrode of the subcarrier.

SUMMARY

An optical semiconductor module according to one aspect of the present disclosure includes a board including a transmission line; a block including a low-permittivity material; an inductor mounted on the block, the inductor being connected with the transmission line via a first wire, the first wire having a first inductance; a semiconductor laser device mounted on the board, the semiconductor laser device being connected with the transmission line via a second wire, the second wire having a second inductance smaller than the first inductance; and a housing configured to accommodate the board, the block, the inductor, and the semiconductor laser device.

An optical semiconductor module according to another aspect of the present disclosure includes a board; a block including a low-permittivity material and a transmission line; an inductor mounted on the block, the inductor being connected with the transmission line via a first wire, the first wire having a first inductance; a semiconductor laser device mounted on the board, the semiconductor laser device being connected with the transmission line via a second wire, the second wire having a second inductance smaller than the first inductance; and a housing configured to accommodate the board, the block, the inductor, and the semiconductor laser device.

BRIEF DESCRIPTION OF THE DRAWINGS

FIG. 3 is a side view schematically illustrating the inductor mounted on the block.

DETAILED DESCRIPTION

Figure 1:
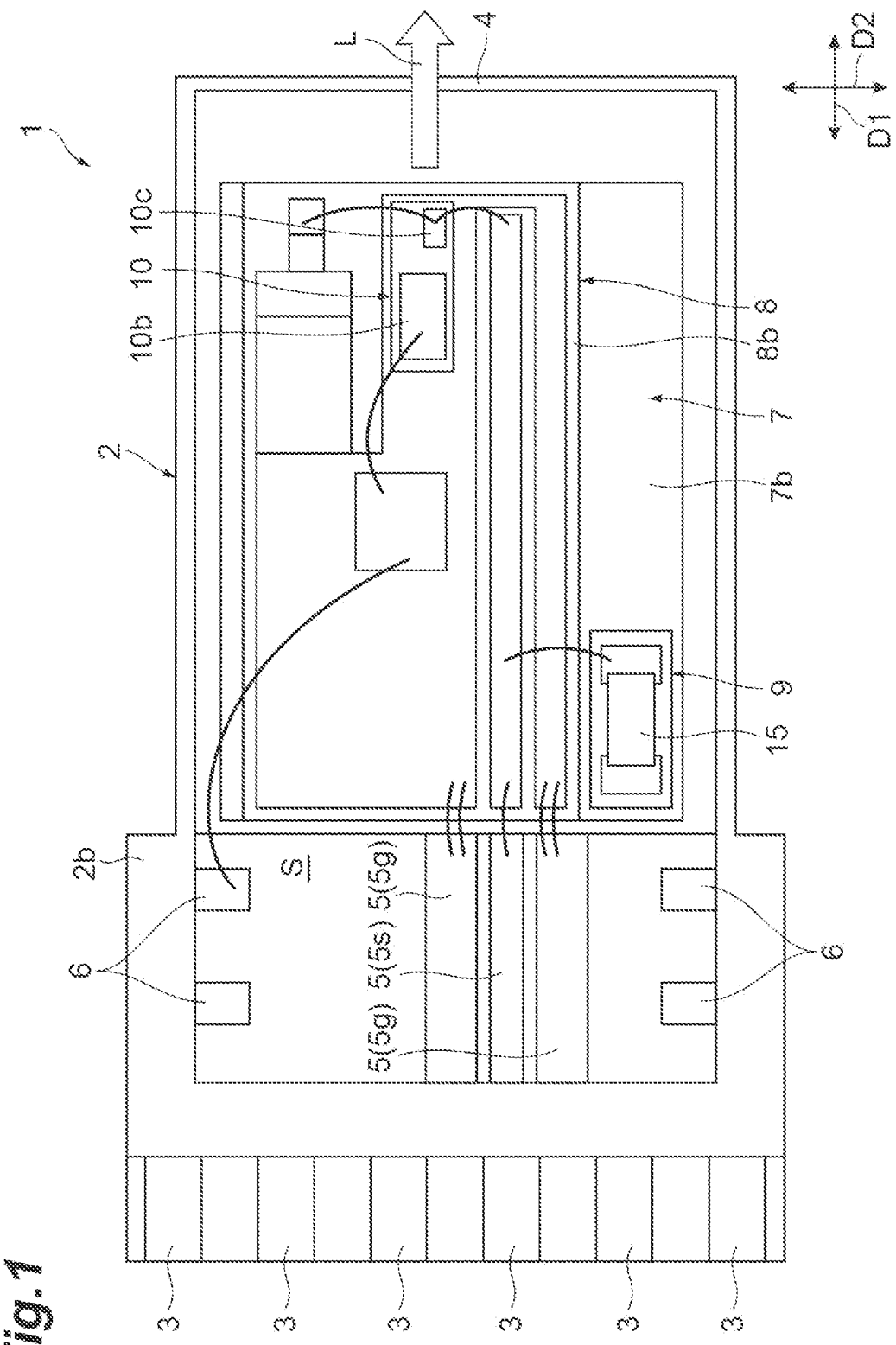
FIG. 1 is a plan view schematically illustrating an internal structure of an optical semiconductor module according to an embodiment.

Specific examples of an optical semiconductor module according to an embodiment of the present disclosure will be described with reference to the drawings. The present invention is not limited to these examples, and is indicated by the scope of claims and is intended to include all modifications within the scope equivalent to the scope of claims. In the description of the drawings, the same or corresponding elements are denoted by the same reference numerals, and duplicate description will be omitted as appropriate. The drawings are partially simplified or exaggerated for the ease of understanding, and the dimensional ratios and the like are not limited to those described in the drawings.

First Embodiment

FIG. 1 is a plan view schematically illustrating an internal structure of an optical semiconductor module 1 according to a first embodiment. The optical semiconductor module 1 includes, for example, a rectangular housing 2 and external terminals 3 provided at one end of the housing 2 in a direction D1 which is the longitudinal direction of the housing 2. The external terminals 3 are aligned at one end of the housing 2 in the direction D1 along a direction D2 which is the width direction of the housing 2. The direction D2 is a direction intersecting the direction D1. The external terminals 3 are, for example, a terminal that receives a high-speed electric signal from the outside, a terminal that receives a drive current of a laser diode, a terminal that receives a drive current of a TEC, a monitor terminal for detecting a temperature of the laser diode, a terminal that supplies a ground potential (reference potential), and the like. As signals exchanged with the outside via the external terminals 3, there are high-speed signals and low-speed signals. The low speed signal includes a DC signal. The housing 2 has an inner wall 2b that defines an internal space S of the housing 2. An optical output unit 4 that outputs a light beam L (optical transmission signal) is provided at an end of the housing 2 opposite to the external terminal 3 in the direction D1.

Figure 2:
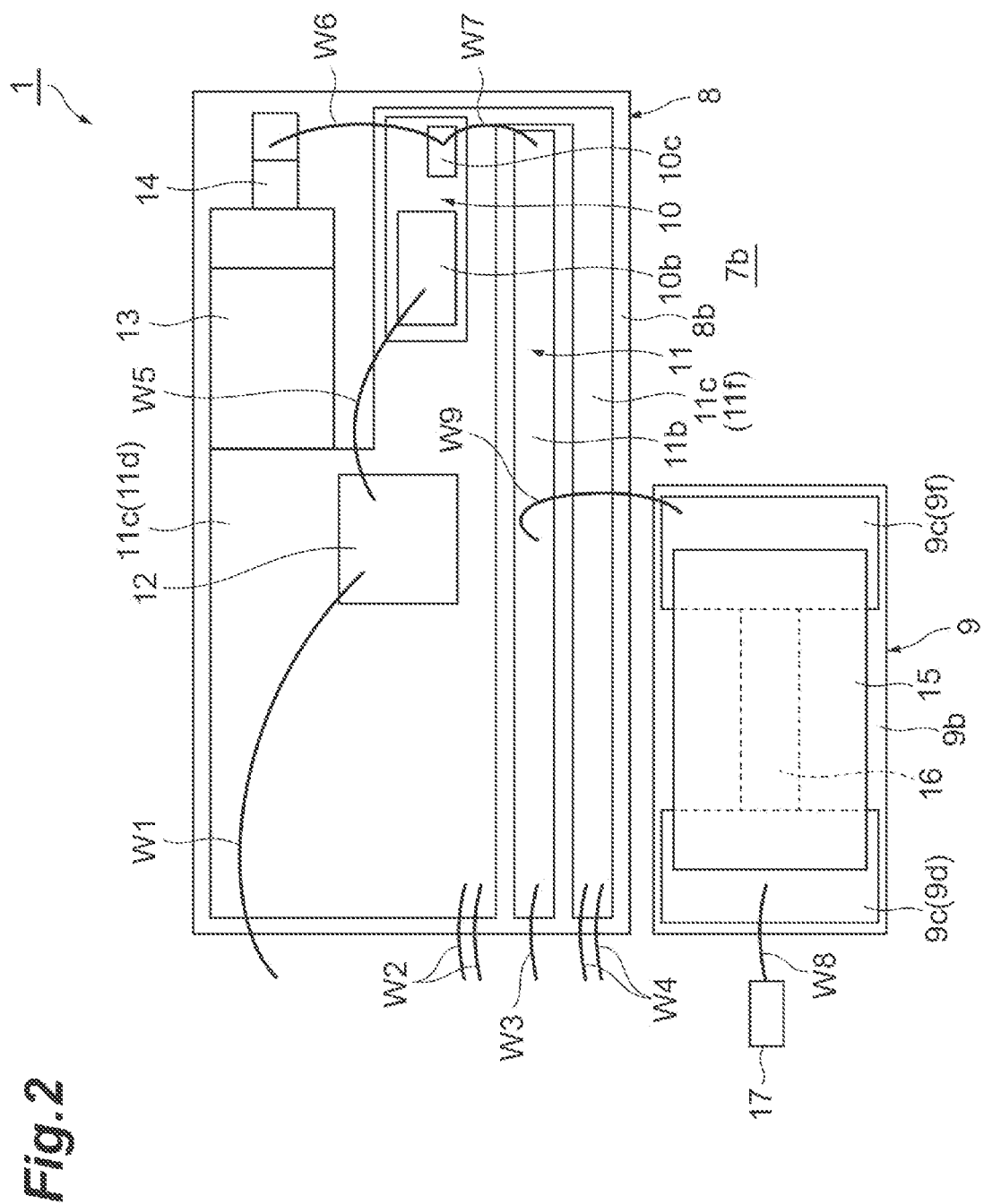
FIG. 2 is a plan view schematically illustrating a substrate on which a semiconductor laser element is mounted and a block on which an inductor is mounted in the optical semiconductor module.
Figure 11:
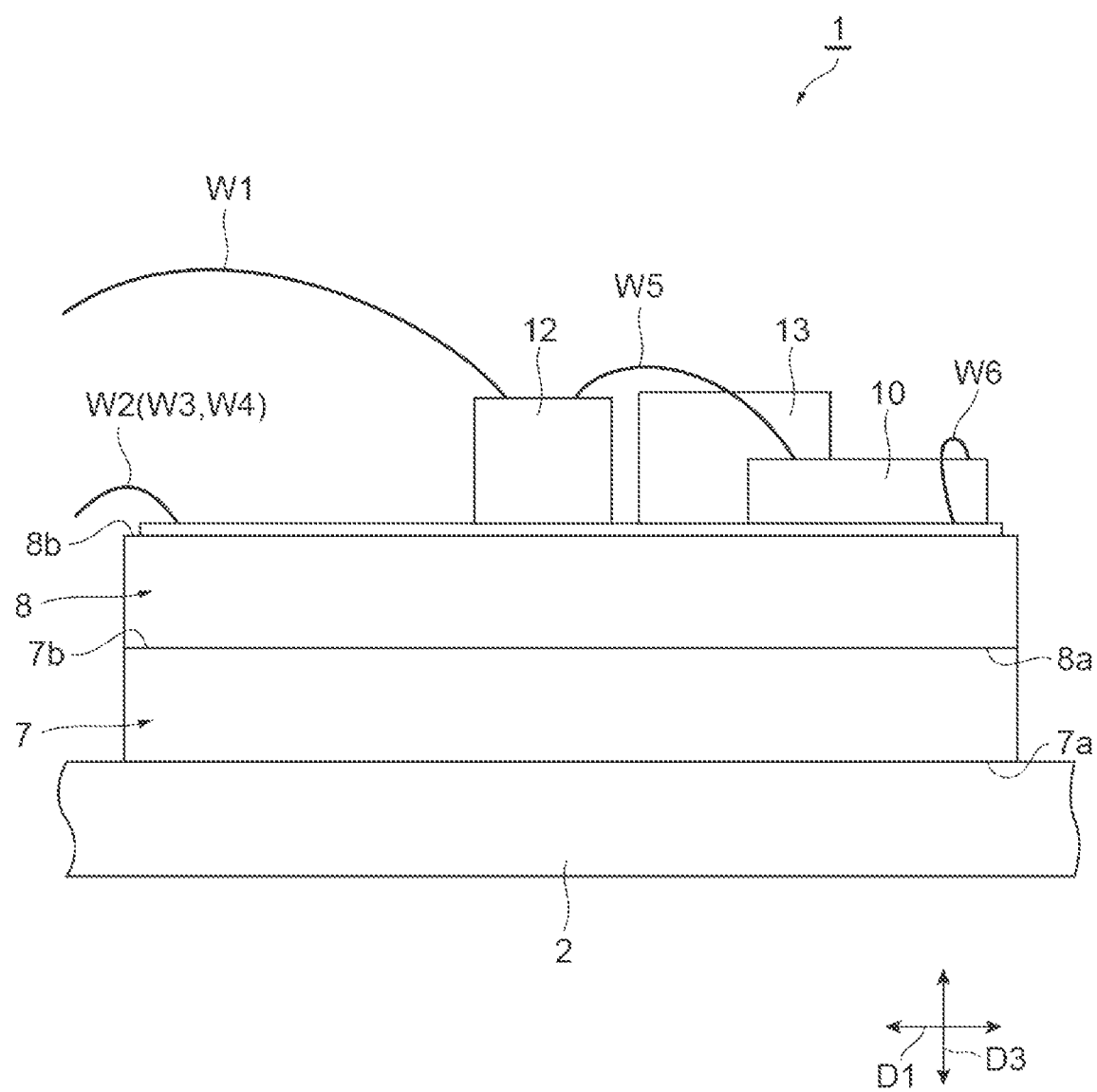
FIG. 11 is a side view schematically illustrating a temperature control element, a substrate, and a semiconductor laser element of the optical semiconductor module of FIG. 2.

The optical semiconductor module 1 includes, for example, a transmission line 5, a pad 6 which is a DC pad, and a thermo-electric cooler (TEC) 7 which is a temperature control element in the internal space S of the housing 2. FIG. 2 is a schematic plan view in which an upper structure of the TEC 7 is enlarged. FIG. 11 is a side view schematically illustrating the upper structure of the TEC 7. As illustrated in FIGS. 1 and 2, the optical semiconductor module 1 includes the TEC 7, an AlN (Aluminum Nitride) substrate 8 (board) on which a semiconductor laser element 10 is mounted, and a block 9 on which an inductor 15 is mounted. The transmission line 5 and the pads 6 are formed on the inner surface of the housing 2. The transmission line 5 and the pads 6 are connected to the external terminals 3 by the wiring penetrating the inner wall 2b. The wirings connecting each of the transmission line 5 and the pad 6 to the external terminal 3 is formed by, for example, metal plating or thin film deposition. The transmission line 5 includes a signal wiring 5s extending in one direction at a certain distance from a ground wiring 5g running in parallel.

For example, the AlN substrate 8 is stacked and mounted on the TEC 7 in a direction D3 which is the height direction. The direction D3 is a direction intersecting direction D1 and direction D2. The housing 2 accommodates, for example, the TEC 7, the AlN substrate 8, the block 9, the semiconductor laser element 10, and the inductor 15 in the internal space S. The TEC 7 has a heat sink surface 7a and a temperature control surface 7b. The TEC 7 is mounted on the housing 2 with the heat sink surface 7a in contact with the housing 2. The temperature control surface 7b is located opposite to the heat sink surface 7a in the direction D3. For example, the heat sink surface 7a and the temperature control surface 7b are planes parallel to the directions D1 and D2. More specifically, for example, the AlN substrate 8 is mounted on the temperature control surface 7b in contact with the temperature control surface 7b. The AlN substrate 8 has a first surface 8a which is a lower surface and a second surface 8b which is an upper surface. The first surface 8a is in surface contact with the temperature control surface 7b. The second surface 8b is a reverse surface of the first surface 8a. The AlN substrate 8 has the second surface 8b opposite to the TEC 7. The semiconductor laser element 10 is mounted on the second surface 8b. The block 9 is juxtaposed with the AlN substrate 8 on the TEC 7. The TEC 7 performs the temperature controlling of, for example, the semiconductor laser element 10. For example, when a predetermined current is allowed to flow through the TEC 7, heat is absorbed in the temperature control surface 7b, and the heat amount absorbed is exhausted from the heat sink surface 7a. At this time, the semiconductor laser element 10 is cooled via the AlN substrate 8. For example, when a current is allowed to flow through the TEC 7 in a direction opposite to the predetermined current, heat is absorbed on the heat sink surface 7a, and the heat amount absorbed is exhausted from the temperature control surface 7b. At this time, the semiconductor laser element 10 is heated via the AlN substrate 8. The block 9 is made of a low dielectric constant material (low-permittivity material). For example, the block 9 is made of quartz. For example, a relative permittivity of the low dielectric constant material is 3 to 5. The AlN substrate 8 includes, for example, an insulator. The relative permittivity of the low dielectric constant material of the block 9 is smaller than the relative permittivity of the insulator of the AlN substrate 8. For example, the relative permittivity of the insulator is 8 to 10. The semiconductor laser element 10 is, for example, an Electro-absorption Modulator integrated Laser (EML). For example, the semiconductor laser element 10 includes a laser diode 10b and an optical modulator 10c (modulator). By maintaining the temperature of the semiconductor laser element 10 at a predetermined temperature, the optical characteristics and the electrical characteristics of the semiconductor laser element 10 can be stabilized against changes in the external environmental temperature. For example, the peak wavelength of the optical signal output from the semiconductor laser element 10 can be maintained within a predetermined range.

FIG. 3 is a side view schematically illustrating the block 9 and the inductor 15. As illustrated in FIGS. 2 and 3, the block 9 has a third surface 9a which is a lower surface and a fourth surface 9b which is an upper surface. The third surface 9a is connected to the temperature control surface 7b. The fourth surface 9b is a surface opposite to the third surface 9a. The fourth surface 9b faces the inductor 15. A wiring 9c is formed on the fourth surface 9b. The block 9 is mounted, for example, on the temperature control surface 7b of the TEC 7. The third surface 9a of the block 9 is in contact with, for example, the temperature control surface 7b of the TEC 7. The TEC 7 is mounted on the inner surface of the housing 2 with the heat sink surface 7a in contact with the inner surface of the housing 2. The fourth surface 9b is, for example, a plane parallel to the direction D1 and the direction D2. The wiring 9c includes, for example, a first wiring 9d provided on the external terminals 3 side and a second wiring 9f provided on the optical output unit 4 side. For example, the first wiring 9d is disposed between the external terminals and the second wiring 9f in the direction D1. For example, the second wiring 9f is disposed between the first wiring 9d and the optical output unit 4 in the direction D1. The first wiring 9d and the second wiring 9f are isolated from each other. A resistor 16 is mounted on the fourth surface 9b. The resistor 16 is disposed, for example, between the first wiring 9d and the second wiring 9f. The resistor 16 is electrically connected between the first wiring 9d and the second wiring 9f. The inductor 15 is electrically connected between the first wiring 9d and the second wiring 9f. One end (first electrode) of the inductor 15 is connected to the first wiring 9d, and the other end (second electrode) of the inductor 15 is connected to the second wiring 9f. The resistor 16 is connected in parallel with the inductor 15 between the first wiring 9d and the second wiring 9f. The optical semiconductor module 1 includes an RC series circuit 17. The inductor 15 is electrically connected between the RC series circuit 17 and a transmission line 11 described later. The inductor 15 functions as, for example, a bias T. The bias T supplies a bias (DC potential) to the transmission line 11. The bias becomes a reference potential of a high frequency signal propagating on the transmission line 11. The bias T has a high impedance at the high frequency as viewed from the transmission line 11, and the influence on the high frequency signal is suppressed to be small. The inductor 15 is mounted on the first wiring 9d and the second wiring 9f. For example, the electrode (first electrode) at one end of the inductor 15 is soldered to the first wiring 9d, and the electrode (second electrode) at the other end of the inductor 15 is soldered to the second wiring 9f. The RC series circuit may be configured by forming, for example, the pads 6 for mounting the resistor on the inner surface of the housing 2 and the pads 6 for mounting the capacitor and connecting these pads by wiring. The wiring to which these pads connect may be formed by plating or vapor deposition.

The AlN substrate 8 has the transmission line 11 on the second surface 8b opposite to the TEC 7. The transmission line 11 includes a ground wiring 11c running in parallel and a high-frequency wiring 11b extending in one direction (D1 direction) while maintaining a constant distance. For example, the ground wiring 11c includes a first ground wiring portion 11d on which a die 12, a chip 13, and a resistor 14 are mounted and a second ground wiring portion 11f located opposite to the first ground wiring portion 11d as viewed from the high-frequency wiring 11b. The second ground wiring portion 11f is located opposite to the first ground wiring portion 11d as viewed from the high-frequency wiring 11b. In other words, the high-frequency wiring 11b is disposed between the first ground wiring portion 11d and the second ground wiring portion 11f in the direction D2. It is noted that the first ground wiring portion 11d and the second ground wiring portion 11f are connected to each other between the high-frequency wiring 11b and the optical output unit 4. Similar to the transmission line 11, the ground wiring 11c may not be the wiring extending in one direction but may be a wide wiring pattern having a portion that maintains a certain distance from the transmission line.

A wire W1, a wire W2, a wire W3, and a wire W4 extend from the die 12, the first ground wiring portion 11d, the high-frequency wiring 11b, and the second ground wiring portion 11f, respectively. For example, the optical semiconductor module 1 further connects a wire W5 connecting the die 12 and the laser diode 10b to each other, a wire W6 connecting one end of the resistor 14 and the modulator 10c to each other, and a wire W7 connecting the high-frequency wiring 11b and the modulator 10c to each other.

Further, the optical semiconductor module 1 includes a wire W8 connecting the RC series circuit 17 and the inductor 15 to each other and a wire W9 connecting the inductor 15 and the transmission line 11 to each other. The wires W1, W2, W3, W4, W5, W6, W7, W8, and W9 are, for example, bonding wires. The diameters of the wires W1, W2, W3, W4, W5, W6, W7, W8, and W9 are, for example, 18 μm, 25 μm, or 50 μm. The diameters of the wires W1, W2, W3, W4, W5, W6, W7, W8, and W9 may have the same value or different values from each other. It is noted that the wires W1, W2, W3, W4, W5, W6, W7, W8, and W9 may not be bonding wires but may be ribbon wires. The ribbon wire has a flat cross section rather than a circular cross section of, for example, a bonding wire. For example, in the ribbon wire, the lateral width of the cross section is twice or more of a thickness of the cross section. The wire W9 corresponds to the first wire connecting the inductor 15 and the transmission line 11 to each other. The wire W7 corresponds to the second wire connecting the semiconductor laser element 10 and the transmission line 11 to each other. An inductance of the wire W9 is larger than an inductance of the wire W7. For example, the wire W9 may be longer than the wire W7. A cross-sectional area (diameter as an example) of the wire W9 may be smaller than a cross-sectional area of the wire W7.

Second Embodiment

Figure 4:
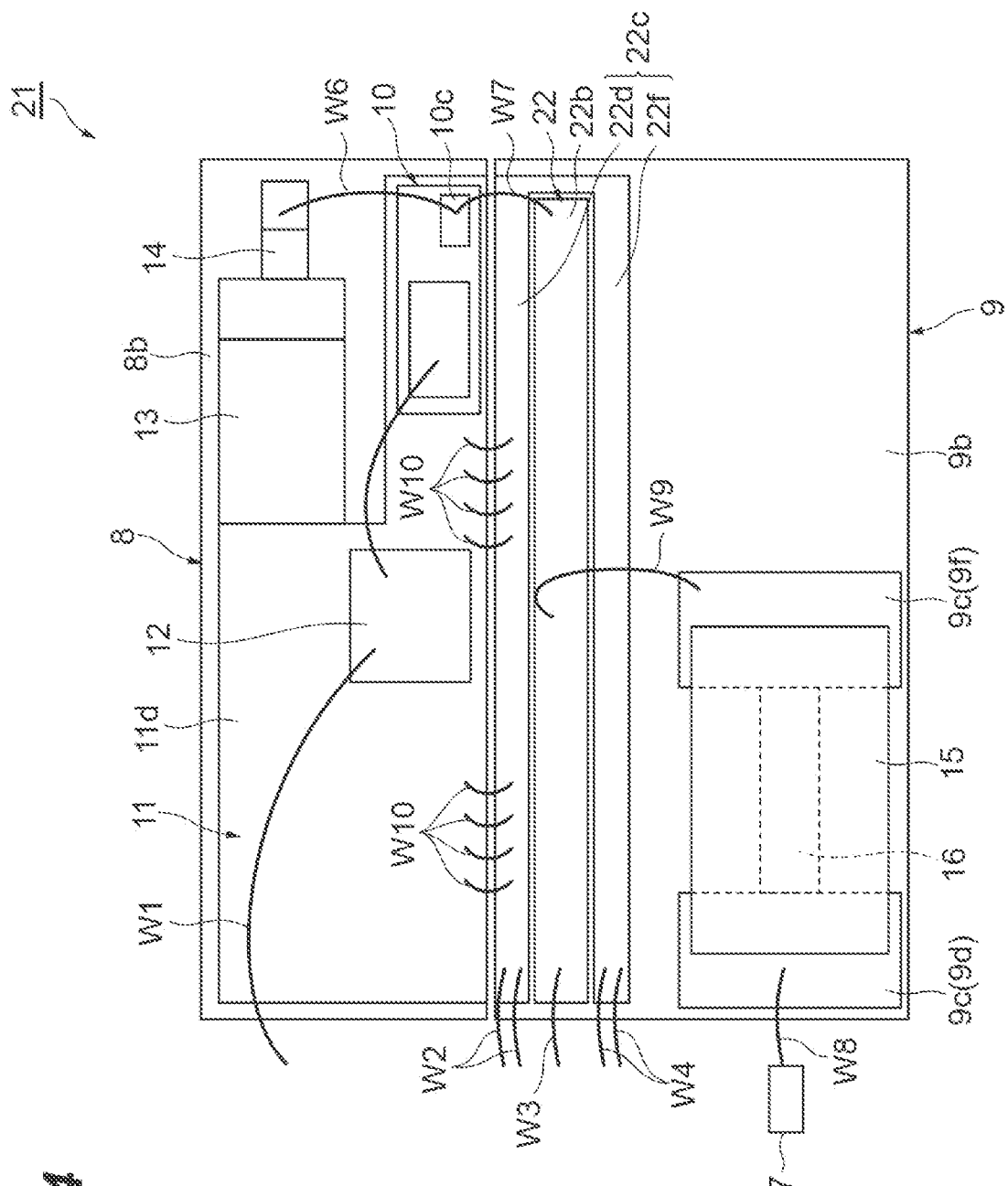
FIG. 4 is a plan view schematically illustrating the substrate on which the semiconductor laser element is mounted and the block on which the inductor is mounted in an optical semiconductor module different from that in FIG. 2.

Next, an optical semiconductor module 21 according to a second embodiment will be described with reference to FIG. 4. The partial configuration of the optical semiconductor module 21 according to the second embodiment is the same as the partial configuration of the optical semiconductor module 1 described above. Therefore, redundant description of the optical semiconductor module 1 is denoted by the same reference numerals as those of the elements of the optical semiconductor module 1 and omitted as appropriate. As illustrated in FIG. 4, in the optical semiconductor module 21, the block 9 has a transmission line 22 on the fourth surface 9b. The transmission line 22 includes a ground wiring 22c running in parallel and a high-frequency wiring 22b extending in one direction at a certain distance. The ground wiring 22c includes, for example, a third ground wiring portion 22d and a fourth ground wiring portion 22f located opposite to the third ground wiring portion 22d as viewed from the high-frequency wiring 22b. For example, in the optical semiconductor module 21, the AlN substrate 8 has only the first ground wiring portion 11d.

The optical semiconductor module 21 further includes, for example, a wire W10 connecting the third ground wiring portion 22d formed on the block 9 and the first ground wiring portion 11d formed on the AlN substrate 8 to each other. In the optical semiconductor module 21, a wire W9 extending from the inductor 15 is connected to the transmission line 22. The wire W7 connects the high-frequency wiring 22b and the modulator 10c to each other. Similar to the optical semiconductor module 1 described above, the inductance of the wire W9 is larger than the inductance of the wire W7.

Next, the functions and effects obtained from the optical semiconductor modules 1 and 21 according to the above-described embodiments will be described. In the optical semiconductor module 1 according to the first embodiment, as illustrated in FIG. 2, the AlN substrate 8 has the transmission line 11. An inductor 15 is mounted on the block 9. The semiconductor laser element 10 is mounted on the AlN substrate 8. The block 9 is made of a low dielectric constant material. Therefore, it is possible to reduce a parasitic capacitance of the wiring 9c formed on the fourth surface 9b with respect to a ground potential. The inductance of the wire W9 connecting the inductor 15 and the transmission line 11 to each other is larger than the inductance of the wire W7 connecting the semiconductor laser element 10 and the transmission line 11 to each other. Since the inductance of the wire W9 connecting the inductor 15 and the transmission line 11 to each other is large, it is possible to suppress the influence on the high frequency signal propagating on the high-frequency wiring 11b even in the state where there is an inductor 15. Then, it is possible to implement a wide band of the frequency characteristics of the optical semiconductor module 1.

In the optical semiconductor module 21 according to the second embodiment, as illustrated in FIG. 4, the block 9 has the transmission line 22, and the inductor 15 is mounted on the block 9. The semiconductor laser element 10 is mounted on the AlN substrate 8. In the optical semiconductor module 21, similar to the optical semiconductor module 1, since the block 9 is made of a low dielectric constant material, the parasitic capacitance of the wiring 9c formed on the fourth surface 9b can be reduced. Since the transmission line 22 is formed on a material having a low dielectric constant as compared with the first embodiment, it is possible to suppress a transmission loss (for example, a dielectric tangent) when transmitting the high frequency signal. Further, similarly to the wiring 9c, the parasitic capacitance of the transmission line 22 can be reduced. Therefore, it is possible to implement a much wider band in the frequency characteristics of the transmission line 22. The inductance of the wire W9 connecting the inductor 15 and the transmission line 22 to each other is larger than the inductance of the wire W7 connecting the semiconductor laser element 10 and the transmission line 22 to each other. Therefore, even in the state where the inductor 15 exists, the influence on the high frequency signal propagating on the high-frequency wiring 22b can be suppressed. Then, it is possible to implement a wide band of the optical semiconductor module 21.

Figure 5:
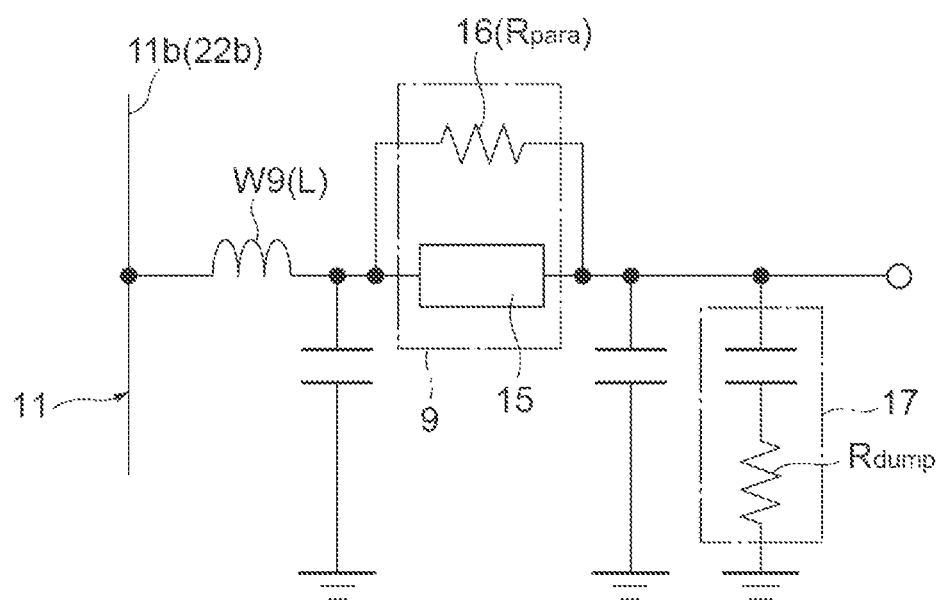
FIG. 5 is a diagram illustrating an equivalent circuit of an exemplary optical semiconductor module.

FIG. 5 is a diagram illustrating an equivalent circuit regarding the bias T of the optical semiconductor module 1

Figure 6:
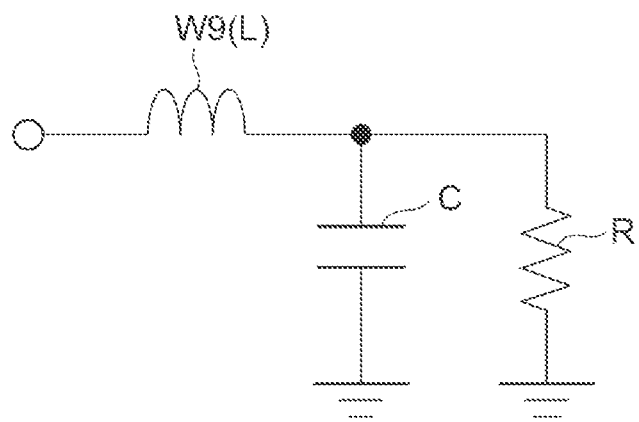
FIG. 6 is a diagram illustrating an equivalent circuit which is a simplification of the equivalent circuit of FIG. 5.

(or the optical semiconductor module 21). The bias T includes, for example, the wire W9, the inductor 15, the resistor 16, and the RC series circuit 17. FIG. 6 is an equivalent circuit that is a simplification of the equivalent circuit of FIG. 5. As illustrated in FIGS. 5 and 6, when the inductance of the wire W9 is denoted by L, the resistance of the resistor 16 is denoted by $R_{para}$, the resistance of the RC series circuit 17 is denoted by $R_{dump}$, and $R=R_{para}+R_{dump}$, then a resonance frequency $\omega_0$ of a series circuit of the inductance L and the RC parallel circuit is expressed by Mathematical Formula (1).

[Mathematical Formula 1]

$$\omega_0 = \sqrt{\frac{1}{LC} - \frac{1}{(CR)^2}} \quad (1)$$

In Mathematical Formula (1), if R→∞, $\omega_0$ is equal to a resonance frequency in a series LC resonance circuit of the inductance L and the capacitance C. On the other hand, the impedance Z ($\omega=\omega_0$) at the resonance frequency $\omega_0$ is expressed by Mathematical Formula (2).

[Mathematical Formula 2]

$$Z(\omega = \omega_0) = \frac{R}{1 + (\omega_0 CR)^2} \quad (2)$$

In the optical semiconductor module 1 (or the optical semiconductor module 21), since R is not 0, the impedance Z ($\omega=\omega_0$) does not become 0, and the smaller the $\omega_0$ (the larger L), the higher the impedance Z. Therefore, under the condition that the value of the product CR of the capacitance C and the resistor R in Mathematical Formulas (1) and (2) is constant, as the value of L is larger, the decrease in impedance at the resonance frequency can be suppressed. As described above, when the inductance L of the wire W9 extending from the inductor 15 is large, it is possible to implement a wide band of the frequency characteristics of the transmission line 11 under the condition that there is an inductor 15.

In this embodiment, the block 9 further has the resistor 16 connected in parallel to the inductor 15. Therefore, the damping effect of the resistor 16 can reduce the dip associated with the parasitic capacitance.

In the present embodiment, the optical semiconductor module 1 (or the optical semiconductor module 21) further includes the RC series circuit 17. The inductor 15 is electrically connected between the RC series circuit 17 and the transmission line 11 (or the transmission line 22). In this case, the transmission dip can be further reduced.

In this embodiment, the block 9 is disposed adjacent to the AlN substrate 8 on the temperature control surface 7b of the TEC 7. Therefore, the block 9 on which the inductor 15 is mounted can be disposed at a position adjacent to the AlN substrate 8. For example, in a plan view from the direction D3, the distance between the block 9 and the AlN substrate 8 can be reduced down to 50 to 150 μm. As a result, the inductor 15 can be disposed close to the transmission line 11 formed on the AlN substrate 8. The transmission line 22 may be formed on the fourth surface 9b of the block 9. In that case, the inductor 15 can be disposed close to the transmission line 22. It is noted that, for example, the AlN substrate 8 and the block 9 are mounted on the temperature control surface 7b of the TEC 7. However, when the semiconductor laser element 10 does not require temperature control, the AlN substrate 8 and the block 9 may be mounted directly on the inner surface of the housing 2.

In the present embodiment, the dielectric constant of the low dielectric constant material of the block 9 is smaller than the dielectric constant of the insulator of the AlN substrate 8. Therefore, since the dielectric constant of the low dielectric constant material of the block 9 is smaller than the dielectric constant of the insulator of the AlN substrate 8, the parasitic capacitance can be further reduced. At this time, a thickness of the AlN substrate 8 may be allowed to be substantially equal to a thickness of the block 9. Accordingly, the parasitic capacitance of the wiring connected to the inductor 15 can be reliably reduced as compared with the case where the inductor 15 is mounted on the AlN substrate 8.

In the present embodiment, the inductance of the wire W9 may be twice or more of the inductance of the wire W7. In this case, it is possible to implement a much wider band.

Figure 7:
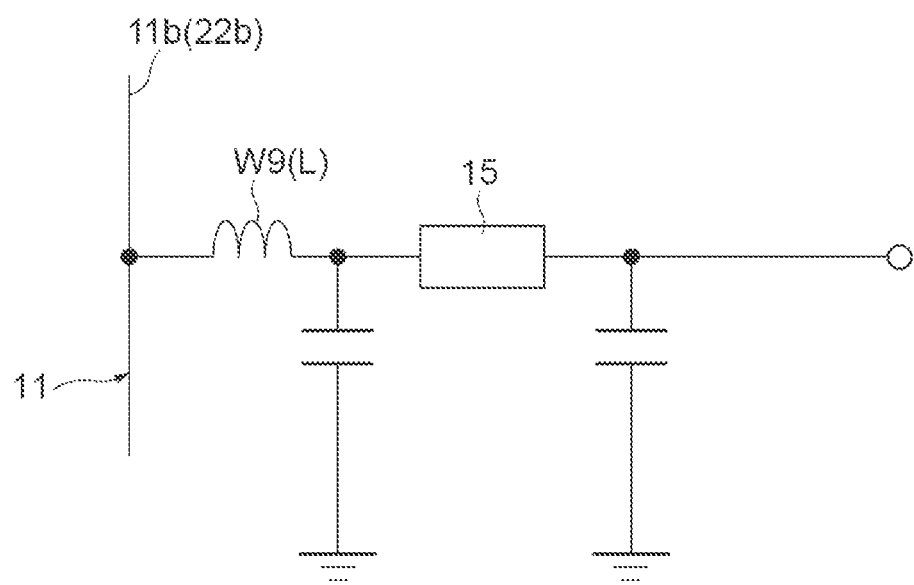
FIG. 7 is a diagram illustrating an equivalent circuit of an optical semiconductor module according to a reference example.

Next, an example will be described. The present invention is not limited to the following example. An optical semiconductor module according to the example is the above-mentioned optical semiconductor module 1. As illustrated in FIG. 5, the optical semiconductor module according to the example includes the resistor 16 disposed in parallel with the inductor 15, and the RC series circuit 17. FIG. 7 illustrates an equivalent circuit relating to the bias T of the optical semiconductor module according to Reference Example. As illustrated in FIG. 7, the optical semiconductor module according to Reference Example does not have a configuration corresponding to the resistor 16 and the RC series circuit 17.

Figure 8:
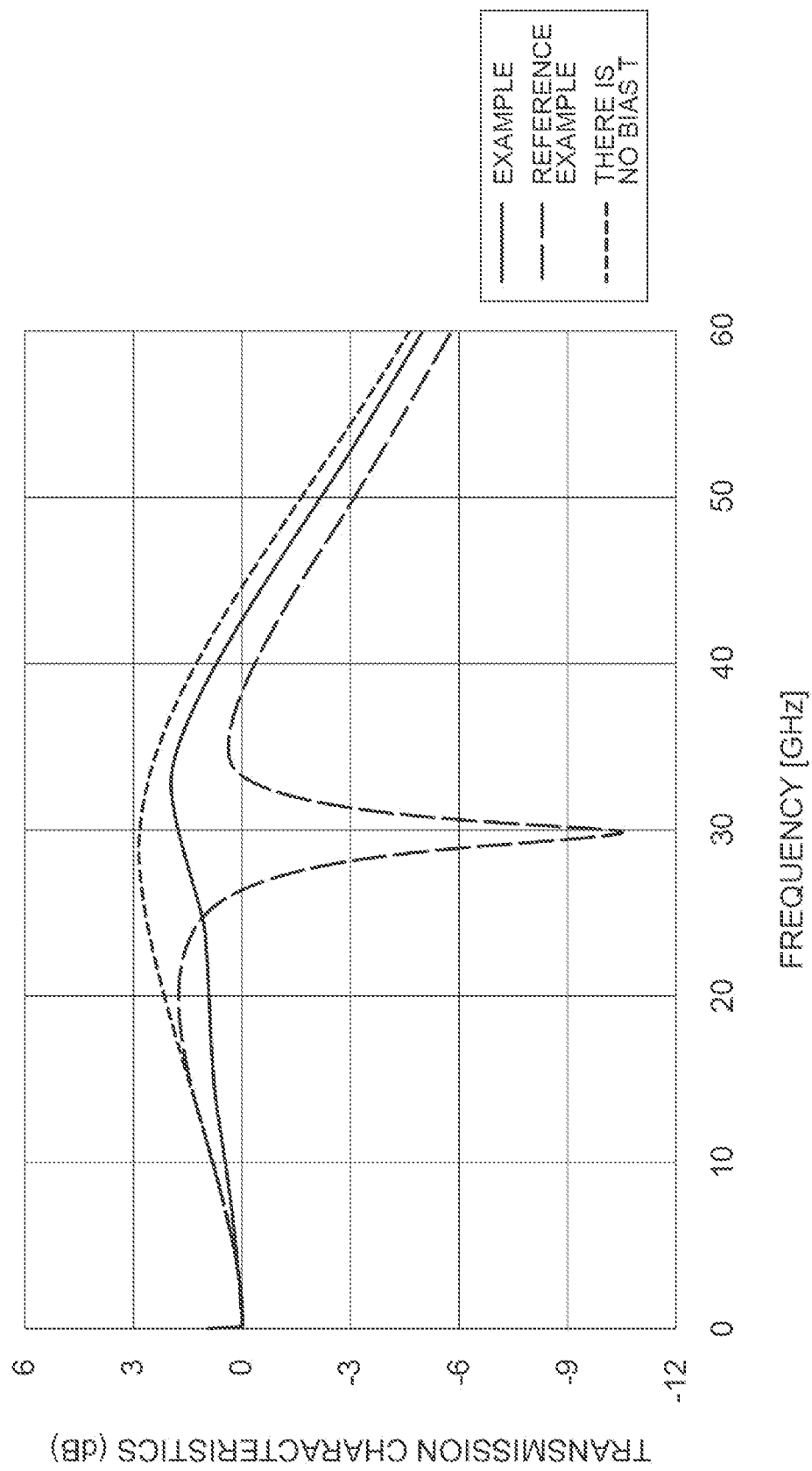
FIG. 8 is a graph illustrating an example of a relationship between frequency and transmission characteristics.

FIG. 8 illustrates the results of simulating the frequency characteristics (transmission characteristics) of the transmission line 11 in each of the optical semiconductor modules of the above Examples and Reference Examples. In FIG. 8, the horizontal axis represents a frequency of a signal transmitted through the transmission line, and the vertical axis represents a ratio of a signal strength (output signal strength) of a signal output from the transmission line with respect to a signal strength (input signal strength) of a signal input to the transmission line in decibel (dB). For example, when the output signal strength is equal to the input signal strength, the output signal strength becomes 0 dB. When the value of the transmission characteristic is larger than 0 dB, the output signal strength is larger than the input signal strength. When the value of the transmission characteristic is smaller than 0 dB, the output signal strength is smaller than the input signal strength. That is, when there is a loss in the transmission line, the output signal strength is smaller than the input signal strength, so that the value of the transmission characteristic becomes small. As illustrated in FIG. 8, in the optical semiconductor module according to Reference Example which does not have the resistor 16 and the RC series circuit 17, a large resonance dip (transmission dip) occurs at a frequency of around 30 GHz. The resonance dip indicates that the signal strength is greatly lost when the signal is transmitted through the transmission line 11. In contrast, it is found that, in the optical semiconductor module according to the embodiment, almost no resonance dip occurs similarly to the case where the bias T is not provided. That is, the loss is significantly suppressed. The bias T is necessary to provide the reference potential for the high frequency signal propagating on the transmission line. The fact that the equivalent characteristics do not deteriorate when the bias T is provided as compared with the case where the bias T is not provided is an example illustrating that the examples are more useful than Reference Examples.

Figure 9:
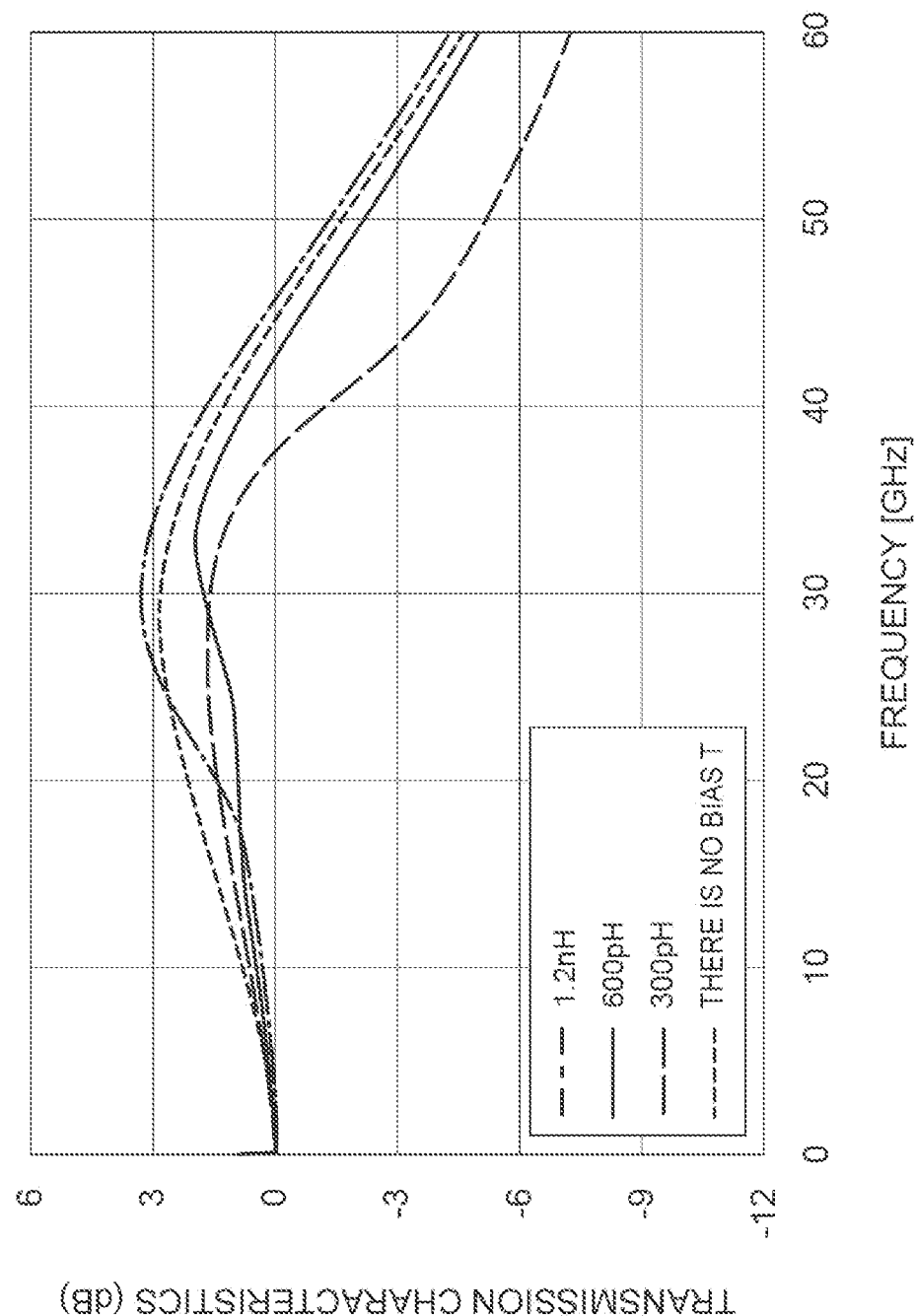
FIG. 9 is a graph illustrating an example of a relationship between frequency and transmission characteristics.

FIG. 9 illustrates the result of simulation of the transmission characteristics when the inductance of the wire W9 is changed in the optical semiconductor module according to Example. As illustrated in FIG. 9, when the inductance of the wire W9 is 300 pH, a slight dip and high frequency loss occur. In contrast, it is found that, when the inductance of the wire W9 is 600 pH or more (600 pH or 1.2 nH), almost no dip and high frequency loss occur similarly to the case where the bias T is not provided.

The embodiments and examples of the optical semiconductor module according to the present disclosure have been described above. However, the present invention is not limited to the above-described embodiments or examples. It is easily recognized by those skilled in the art that the present invention can be changed and modified in various forms within the scope of the spirit described in the claims.

Figure 10:
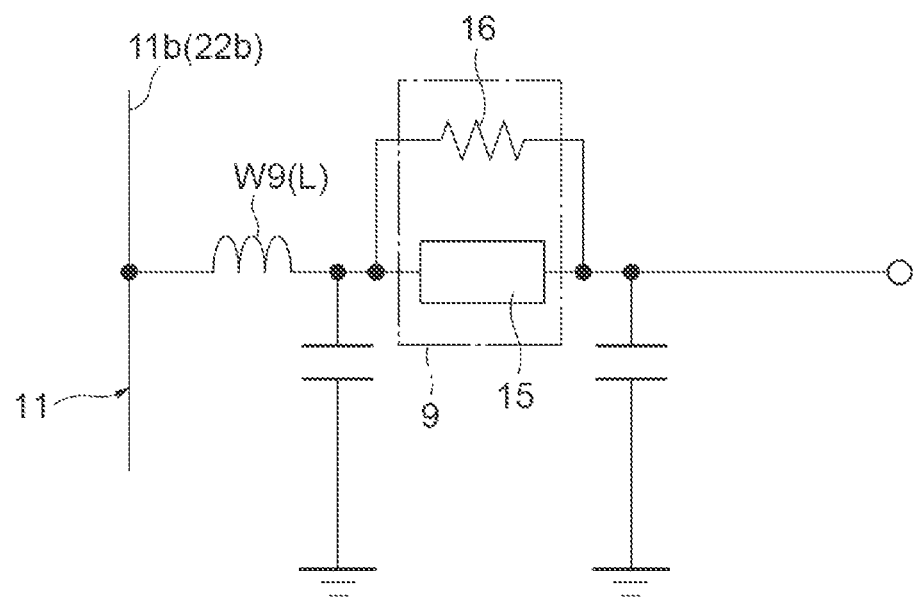
FIG. 10 is a diagram illustrating an equivalent circuit of an optical semiconductor module according to a modified example.

For example, in the above-described embodiment, as illustrated in FIG. 5, the optical semiconductor module 1 and the optical semiconductor module 21 including the resistor 16 and the RC series circuit 17 are described. However, as illustrated in FIG. 10, the optical semiconductor module may be, for example, an optical semiconductor module 25 which does not include the RC series circuit 17. At least one of the resistor 16 and the RC series circuit 17 may be omitted.

In the above-described embodiment, the example where the die 12, the chip 13, and the resistor 14 are mounted on the transmission line 11 is described. However, the type and number of elements mounted on the transmission line 11 are not limited to the above example and can be changed as appropriate. In the above-described embodiment, the example where the semiconductor laser element 10 is EML is described. However, the semiconductor laser element may be a semiconductor laser element other than EML.

In the above-described embodiment, the example where the substrate is an AlN substrate 8 and the block 9 is a quartz substrate is described. However, the material of the substrate may be other than AlN. The block may be made of alumina, FPC or polyimide. That is, the materials of the substrate and the block are not particularly limited as long as the dielectric constant of the low dielectric constant material of the block 9 is smaller than the dielectric constant of the insulator of the substrate.

What is claimed is:

1. An optical semiconductor module comprising:
    a board including a transmission line, the transmission line including a high-frequency wiring extending in a first direction and a ground wiring running in parallel with the high-frequency wiring, the high-frequency wiring having a constant distance from the ground wiring;
    a block including a low-permittivity material;
    an inductor mounted on the block, the inductor being connected with the high-frequency wiring via a first wire, the first wire having a first inductance;
    a semiconductor laser device mounted on the board, the semiconductor laser device being connected with the high-frequency wiring via a second wire, the second wire having a second inductance smaller than the first inductance; and
    a housing configured to accommodate the board, the block, the inductor, and the semiconductor laser device.

2. The optical semiconductor module according to claim 1, wherein the block further has a resistor connected in parallel with the inductor.

3. The optical semiconductor module according to claim 1, further comprising an RC series circuit,
    wherein the inductor is connected between the RC series circuit and the high-frequency wiring.

4. The optical semiconductor module according to claim 1, wherein the block is disposed adjacent to the board inside the housing.

5. The optical semiconductor module according to claim 1, wherein a dielectric constant of the low-permittivity material is smaller than a dielectric constant of an insulator of the board.

6. The optical semiconductor module according to claim 1, wherein the inductance of the first wire is twice or more of the inductance of the second wire.

7. An optical semiconductor module comprising:
    a board;
    a block including a low-permittivity material and a transmission line, the transmission line including a high-frequency wiring extending in a first direction and a ground wiring running in parallel with the high-frequency wiring, the high-frequency wiring having a constant distance from the ground wiring;
    an inductor mounted on the block, the inductor being connected with the high-frequency wiring via a first wire, the first wire having a first inductance;
    a semiconductor laser device mounted on the board, the semiconductor laser device being connected with the high-frequency wiring via a second wire, the second wire having a second inductance smaller than the first inductance; and
    a housing configured to accommodate the board, the block, the inductor, and the semiconductor laser device.

8. The optical semiconductor module according to claim 7, wherein the block further has a resistor connected in parallel with the inductor.

9. The optical semiconductor module according to claim 7, further comprising an RC series circuit,
    wherein the inductor is connected between the RC series circuit and the high-frequency wiring.

10. The optical semiconductor module according to claim 7, wherein the block is disposed adjacent to the board inside the housing.

11. The optical semiconductor module according to claim 7, wherein a dielectric constant of the low-permittivity material is smaller than a dielectric constant of an insulator of the board.

12. The optical semiconductor module according to claim 7, wherein the inductance of the first wire is twice or more of the inductance of the second wire.

* * * * *